US011281171B2

(12) United States Patent
Ciciriello et al.

(10) Patent No.: US 11,281,171 B2
(45) Date of Patent: Mar. 22, 2022

(54) METHODS AND SYSTEMS FOR CONTROLLING MACHINE VIBRATION

(71) Applicant: ROLLS-ROYCE plc, London (GB)

(72) Inventors: Lucia Ciciriello, Derby (GB); Lixin Ren, Derby (GB)

(73) Assignee: ROLLS-ROYCE plc, London (GB)

( * ) Notice: Subject to any disclaimer, the term of this patent is extended or adjusted under 35 U.S.C. 154(b) by 66 days.

(21) Appl. No.: 16/429,402

(22) Filed: Jun. 3, 2019

(65) Prior Publication Data
US 2019/0384245 A1 Dec. 19, 2019

(30) Foreign Application Priority Data

Jun. 19, 2018 (GB) ...................... 1809995

(51) Int. Cl.
*G05B 17/02* (2006.01)
*G06F 30/23* (2020.01)
*G06F 30/15* (2020.01)

(52) U.S. Cl.
CPC ............. *G05B 17/02* (2013.01); *G06F 30/23* (2020.01); *G06F 30/15* (2020.01)

(58) Field of Classification Search
CPC ............... G05B 17/02; G05B 23/0254; G05B 2219/37435; G05B 2219/37434;
(Continued)

(56) References Cited

U.S. PATENT DOCUMENTS 6,185,470 B1 * 2/2001 Pado .................. G05B 13/027
700/104
2012/0303350 A1 11/2012 Tsai et al.
(Continued)

FOREIGN PATENT DOCUMENTS

CN 107341276 A 11/2017
WO 00/70509 A1 11/2000

OTHER PUBLICATIONS

Arias-Montiel et al. "Active Vibration Control in a Rotor System by an Active Suspension with Linear Actuators", Journal of Applied Research and Technology, vol. 12, Oct. 2014, pp. 898-907. (Year: 2014).*

(Continued)

*Primary Examiner* — Eunhee Kim
(74) *Attorney, Agent, or Firm* — Oliff PLC

(57) ABSTRACT

A machine having a plurality of sub-assemblies, having a geometric computational model is generated for the machine, including the sub-assemblies and one or more module of machine readable code defining how vibration is communicated through said geometric model. First and second instances of the computational model are run to generate outputs of loading throughout the machine geometry as a result of the vibration of the geometric model under a simulated machine operating condition. The first and second instances respectively includes the computational model with and without inclusion of vibration induced by a control system for one or more sub-assembly of the machine. A maximum loading threshold is determined for the machine. A threshold for one or more control parameter in the control system is set based on the contribution of the vibration induced by the control system to the maximum loading threshold.

16 Claims, 4 Drawing Sheets

(58) Field of Classification Search
CPC .......... G06F 30/23; G06F 30/00; G06F 30/10; G06F 30/17; G06F 2111/00; G06F 2111/10; G06F 30/15; Y02T 90/00
See application file for complete search history.

(56) References Cited

U.S. PATENT DOCUMENTS

| | | | | |
|---|---|---|---|---|
| 2013/0170947 | A1* | 7/2013 | Kurt-Elli | F01D 25/06 415/1 |
| 2015/0347670 | A1* | 12/2015 | James | F16H 57/00 703/2 |
| 2018/0017042 | A1* | 1/2018 | Baun | H02P 9/04 |

OTHER PUBLICATIONS

Dubay et al. "Finite element based model predictive control for active vibration suppression of a one-link flexible manipulator", ISA Transactions, vol. 53, No. 5, 2014, pp. 1609-1619. (Year: 2014).*

Mystkowski, "Sensitivity and Stability Analysis of Mu-Synthesis AMB Flexible Rotor". Solid State Phenomena. DOI: 10.4028/www.scientific.net/SSP.164.313. Jun. 2010. 8 Pages. (Year: 2010).*

Guan et al. "Sensitivity analysis of brake squeal tendency to substructures' modal parameters". Journal of Sound and Vibration 291 (2006). pp. 72-80. (Year: 2006).*

Nov. 15, 2018 British Search Report issued in British Patent Apllication No. 1809995.2.

Dubay, Rickey et al. "Finite element based model predictive control for active vibration suppression of a one-link flexible manipulator". ISA Transactions, vol. 53, pp. 1609-1619, 2014.

M. Arias-Montiel et al. "Active Vibration Control in a Rotor System by an Active Suspension with Linear Actuators". Journal of Applied Research and Technology, vol. 12, pp. 898-907, 2014.

Dec. 3, 2019 Extended European Search Report issued in European Patent Application No. 19177634.3.

* cited by examiner

METHODS AND SYSTEMS FOR CONTROLLING MACHINE VIBRATION

BACKGROUND OF THE DISCLOSURE

The present disclosure concerns methods and systems for assessing and controlling machine vibration, for example control system generated vibration in complex assemblies such as aircraft engines.

The problem of unwanted vibrations in complex machines has been discussed at length in the art. An increase in amplitude of vibration, e.g. at resonant or harmonic frequencies, can cause a variety of mechanical problems, including increased stress, wear and noise, as well as a reduction in efficiency. In some instances, unchecked vibration can lead to unexpected failure modes. More typically in complex machines that are subjected to equipment health monitoring, unwanted vibration will lead to prolonged degradation and a reduction in expected component, sub-assembly or machine life.

It is known to construct a computational model for a machine in order to predict and reduce the response of the machine during operational conditions.

Finite element analysis (FEA) techniques are conventionally used to investigate system behaviour under loading/excitation that is expected in operation, for a given geometry and material properties. The geometry is discretised into a multitude of elements and the relevant mathematical equations are calculated for each element in order to predict how stress, movement, thermal energy, etc will be communicated throughout the geometry. Individual models for components and subassemblies can be generated with the interactions between the subassemblies being used to build up a wider understanding of the machine as a collective whole.

It is also known to build and run mathematical models in order to simulate the control system structural interactions, e.g. using software such as Simulink®. These models focus on reproducing the electrical feedback loop behaviour. Interactive adjustment of the system settings in order to achieve the desired controller behaviour is referred to as tuning. The electrical setting in turn interacts with the structural properties of the system (e.g. by way of stiffness's, inertias and damping), generating a combined vibrational response that under certain circumstances may become detrimental. The commercially available software applications are specialised either in the Three dimensional (3D) structural simulation or in the control system simulation, combined with a simplified structural model (often called plant model).

However it can be significant undertaking, even for an individual component or simple sub-assembly, to predict the behaviour of the system when there are multiple vibration modes and frequencies, typically involving three dimensional analysis over a range of normal operational conditions. When electrical and structural interactions need to be simulated together involving the large variety of sub-assemblies that a larger machine typically includes, the complexity of the computational modelling task is increased significantly. In order to simplify the models and reduce the computational time, a series of simplifications are often introduced, with the effect of generating more manageable models but being unable to optimise the control system structural coupled response at operational conditions as required (e.g. engine speed thrust envelope).

FEA techniques do not model the system behaviour perfectly and there are ongoing attempts to improve how the available FEA results can be used in the product design process. In addition, the software tools that are commonly used to model and tune control system electronics have a limited capability in terms of the 3-Dimensional simulation of the structural assembly.

Whilst existing tuning procedures do allow an acceptable level of control system stability in operation and vibration-mitigating refinements to be implemented during the design process, there are inevitably unexpected patterns of vibration related to novel optimised designs and more extended flight conditions. Even though damping mechanisms are commonly put in place to manage certain interactions within complex machines, often mechanical vibration-damping controls add weight and introduce non-linearities that may reduce the overall efficiency of the machine.

It may be considered an aim of the disclosure to mitigate one or more of the above-identified problems, e.g. reducing detrimental control system generated vibration. It may be considered an additional or alternative aim to improve the manner in which vibration findings during a machine design stage can affect machine operation.

BRIEF SUMMARY OF THE DISCLOSURE

According to the present disclosure there is provided a method of managing vibration in a machine having a plurality of sub-assemblies, the method comprising: generating a computational model for the machine, the computational model comprising a geometric model of the machine comprising the sub-assemblies and one or more module of machine readable code defining how vibration is communicated through said geometric model; running a first and a second instance of the computational model to generate outputs comprising loading on the machine geometry as a result of the vibration of the geometric model under a simulated machine operating condition, wherein the first and second instances respectively comprise the computational model with and without inclusion of vibration induced by a control system for one or more sub-assembly of the machine; determining a maximum loading threshold for the machine; and setting a threshold for one or more control parameter in the control system based on the contribution of the vibration induced by the control system to the maximum loading threshold.

The threshold for one or more control parameter may be set in the control system based on the contribution of the vibration induced by the control system so as not to exceed the maximum loading threshold.

Running the first instance may comprise determining using the first instance dynamic loading and/or stress generated by the control system induced vibration at one or more locations in the machine.

Running the second instance may comprise calculating dynamic loading and/or stress generated by a residual unbalance of the machine.

The simulated machine operating condition, may comprise a set of simulated machine operating conditions.

The maximum loading threshold may comprise a maximum allowable loading threshold for the machine, e.g. determined in order to ensure the whole system structural integrity throughout the operational envelope.

The method may comprise implementing the control parameter threshold in the control system of the machine, e.g. within a memory of the control system.

The method may comprise operating the machine including the control system according to the set threshold for one or more control parameter.

The computational model may generate outputs comprising loading on the machine geometry under a plurality or range of simulated machine operating conditions, e.g. over a range of normal operating conditions.

The loading threshold may comprise a stress threshold and/or a vibration amplitude threshold.

The computational model may model the interaction between the plurality of sub-assemblies of the machine.

The computational model may be a whole machine model.

The machine geometric model may comprise a computer aided design (CAD) model.

The machine geometry may comprise a discretised geometry model in which solid material in the geometric model is discretised into multiple elements. The computational model may comprise a finite element analysis (FEA) model.

The method may comprise generating a further computational model for the machine. Said further model may comprise a mathematical model of machine operation for tuning machine operation, e.g. in order to adhere to the maximum loading threshold.

Said further computational model may comprise a computational model of the control system, e.g. comprising a simplified structure of the machine, in which the loading threshold is applied.

The further computational model may comprise a model of the electrical feedback loop properties and/or the sensitivity to electrical/control settings.

The mathematical model may comprise machine readable code defining the contribution of the vibration induced by the control system to the overall vibration generated by the machine.

The method may comprise using the mathematical model to update or refine the operation of the control system, e.g. to update or refine the threshold for the one or more control parameter.

The setting of the threshold for one or more control parameter under the control of the control system may comprise setting one or more value of a filter, an active damper setting, or a PID control parameter in the control system.

The control system may operate according to one or more control loop. The control system may comprise a PID controller.

The machine may comprise a rotor, e.g. an engine, compressor/pump and/or turbine. The machine may comprise a plurality of rotors. The machine may comprise an axial flow machine. The machine may comprise a gas turbine engine.

The method may comprise a method of setting control system parameter thresholds for controlling operation of a machine. The method may comprise a method of controlling a machine.

The method may comprise sensing vibration on the machine in use. Stress and/or displacement may be sensed at locations in the machine corresponding to locations in the model.

The method may comprise adjusting the threshold for the one or more control parameter based on the sensed vibration. The mathematical model may be used for said adjustment.

The control system may operate based on the mathematical model, e.g. based on control system parameter settings output by the mathematical model. A dynamic system may be established whereby the mathematical model is updated using machine operation data and the control system parameter settings are updated by iteratively rerunning the mathematical model using the machine operation data.

The control system may inject energy in use in order to prevent exceedance of the maximum loading threshold.

The control system may comprise a controller and a data store. The controller may comprise machine readable instructions for controlling operation of one or more actuator of the machine.

According to a second aspect of the disclosure, there is provided a method of managing vibration in a machine having a plurality of sub-assemblies, the method comprising: generating a first computational model for the machine, the first computational model comprising a geometric model of the machine comprising the sub-assemblies and one or more module of machine readable code defining how vibration is communicated through said geometric model; running an instance of the first computational model to generate outputs comprising loading on the machine geometry as a result of the vibration of the geometric model under a simulated machine operating condition; determining a maximum loading threshold for the machine from said first computational model;

setting a threshold for one or more control parameter under the control of the control system based on the maximum loading threshold; feeding said threshold to a second computational model that simulates the control system electrical response for the machine; running a tuning procedure for machine operation using the second computational model; and, outputting one or more control parameter value or control signal for the machine based on the output of said tuning procedure.

According to a third aspect of the disclosure there is provided a control system for managing machine vibration corresponding to the method of the first or second aspect.

According to a fourth aspect of the disclosure, there is provided a data carrier or computer storage medium comprising machine readable instructions for implementing the method of the first or second aspect and/or the computational or mathematical model for said method.

The skilled person will appreciate that except where mutually exclusive, a feature described in relation to any one of the above aspects may be applied mutatis mutandis to any other aspect. Furthermore, except where mutually exclusive any feature described herein may be applied to any aspect and/or combined with any other feature described herein.

BRIEF DESCRIPTION OF THE DRAWINGS

Embodiments will now be described by way of example only, with reference to the Figures, in which.

DETAILED DESCRIPTION

The following description proceeds with reference to a machine in the form of a gas turbine engine. However the disclosure equally encompasses other complex machines having multiple subsystems and control systems for controlling operation of the engine in response to control inputs and sensor readings for monitoring machine operation. Other machines could comprise for example, power plants and generators, industrial pumping equipment, or other types of engines and propulsion systems.

A conventional gas turbine engine represents an example of a complex machine having a multitude of assemblies and sub-assemblies, various examples of which will be discussed below.

The present disclosure derives from a general aim to minimise unwanted critical structural interactions that generates vibration between the engine/rig and its control systems. The approach described herein is to adjust how structural simulations are performed such that the outputs of those simulations can provide targets or thresholds for to be met specifically by the control systems, e.g. being achievable during a tuning procedure for the control systems.

The targets may be numerical targets that may be calculated at a whole system level, e.g. accommodating the modelled interactions between all key assemblies/sub-assemblies of the machine. This is unlike conventional techniques for control system tuning, in which the tuning procedure is performed only with a general overall aim but without specific targets being set for residual vibration based on control parameters such as speeds (e.g. rotation/shaft speeds), torque, loads, displacements, etc.

When high vibration due to structural interactions appear very often a failure arrives before having the time to intervene by retuning of the system, e.g. because low cycle fatigue (LCF) and high cycle fatigue (HCF) cycles can cumulate quickly such that control systems are unable to react.

Figure 1:
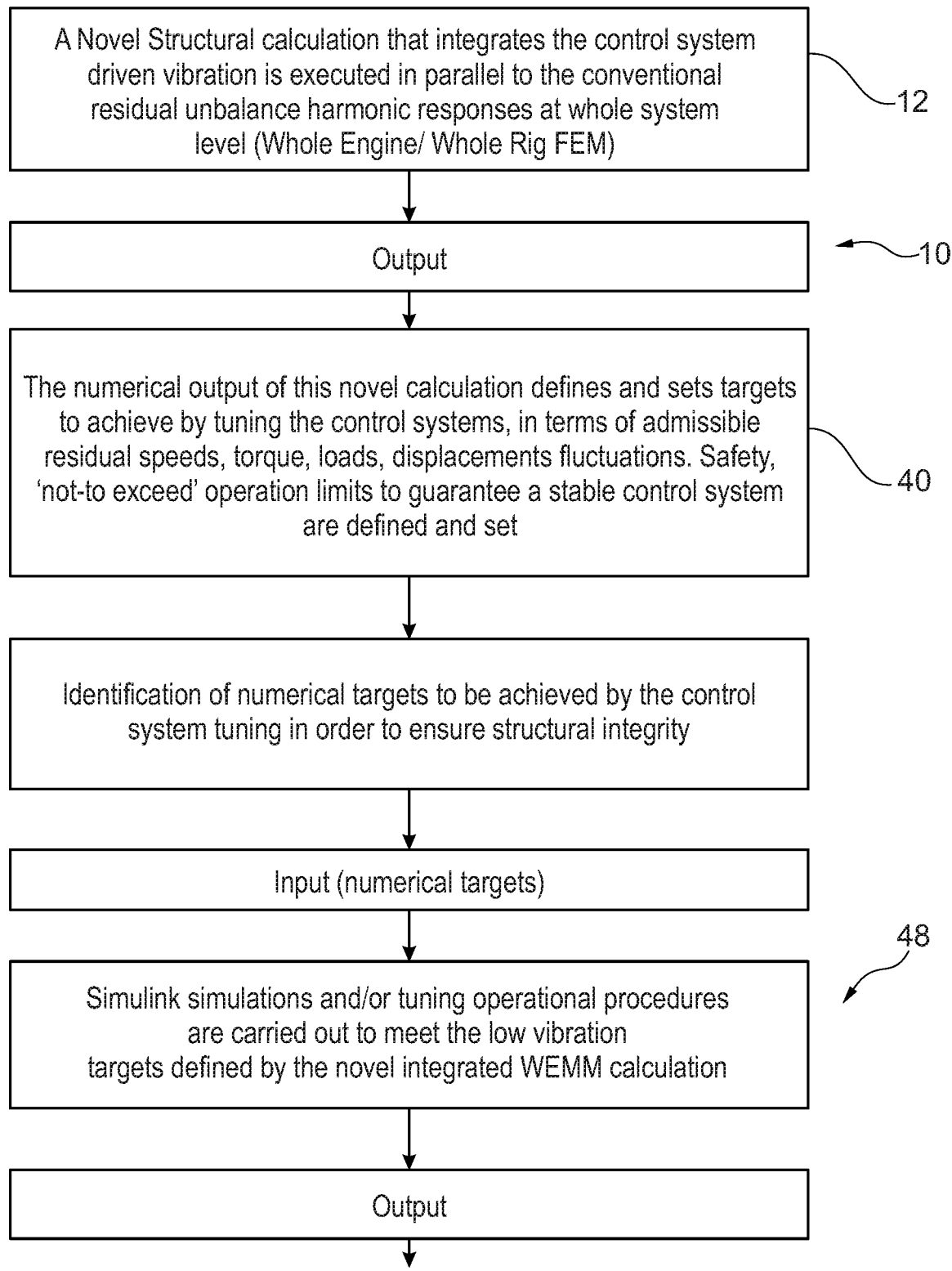
FIG. 1 is a flow diagram of an overview of a method according to an example of the present disclosure.

Turning to FIG. 1, there is shown an overview of the basic steps taken in a method for improving the operation of control systems that contribute to vibration in an engine.

The steps in stage 10 are performed within a finite element modelling/analysis environment. There are numerous FEA packages commercially available and the operation of such software will not be described in detail here. Finite element methods involve importing or generating conventional computer aided design (CAD) models in which the geometry of components, sub-assemblies, assemblies and whole machines is mathematically defined in a three-dimensional simulated space, e.g. relative to orthogonal axes. The solid parts of the geometric model are subdivided or discretized into elements for the purpose of performing the relevant equations to resolve the underlying physical characteristics for each element in turn in order to obtain a picture of the relevant variables for the whole geometry. Obtaining a meaningful solution involves iteratively repeating the process to converge on final solution.

The process of discretisation of the domain of interest is typically referred to meshing such that the locations for performing calculations in the geometric model can be defined by nodes at intersections in the mesh or within the elements defined by the lines forming the mesh. The mesh is superimposed on the continuous domain of interest and does not modify the geometry.

Operating conditions are applied to the model, e.g. as a set of inputs or boundary conditions at specified locations in the model, in order to see how the input conditions will be communicated throughout the geometry; that is to say, how the various parts of the engine will respond to the inputs. For vibration, the inputs include sources of movement/excitation, for example caused by rotation of shafts or actuation of other mechanical components. As well as the amplitude, direction and frequency of motion, FEA techniques can output the corresponding stress/strain and its location in the geometric model.

Figure 2:
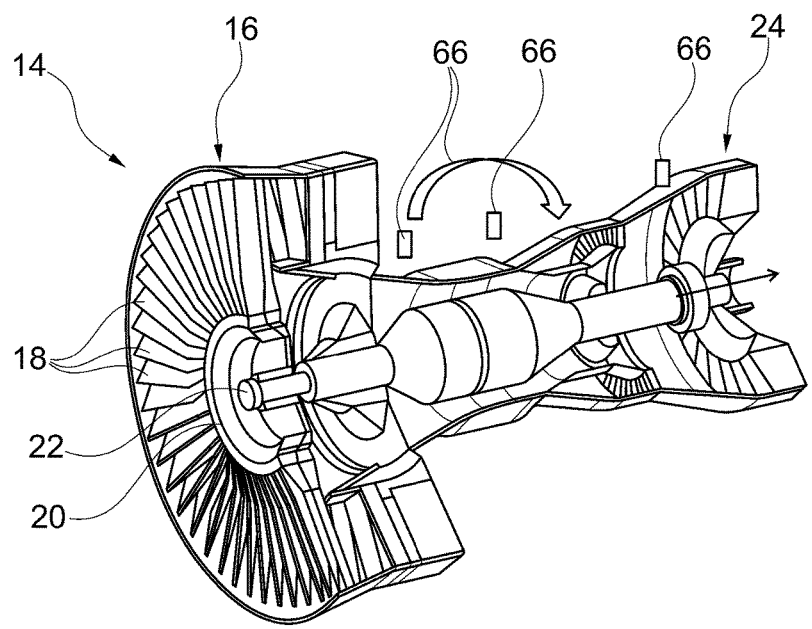
FIG. 2 shows a part-cut-away view of a three-dimensional geometric model of a machine.

At step 12 different finite element analyses are performed for a common geometric (CAD) model. An example of a computation FEA model geometry is shown in FIG. 2. Here it can be seen that a whole machine/engine model 14 has been constructed, in which multiple assemblies, sub-assemblies and components are captured as well as the interfaces/connections there-between such that the manner in which vibration is communicated throughout the whole engine can be analysed.

For example, a fan assembly 16 at the leading end of the engine comprises a radial array of fan blades 18 attached to a common wheel 20, which is in turn mounted to a low pressure shaft 22. The low pressure (LP) shaft is supported at a plurality of locations along its length by bearings and terminates at the downstream end of the engine at a LP turbine assembly 24, which itself comprises a plurality of turbine blades. The turbine assembly 24 communicates mechanically with the fan assembly 16 via the shaft 22, thereby defining a larger LP spool assembly having therein sub-assemblies which mechanically interact.

The engine model also includes an intermediate pressure (IP) shaft interconnecting an IP compressor with an IP turbine, thereby defining an IP rotor/spool assembly which is mounted radially outside the LP assembly. A corresponding HP rotor/spool assembly is mounted radially outside of the IP shaft. Thus a complex assembly is provided having a plurality of spools rotating independently within a static outer nacelles and internal casing structures. A number of vanes, struts and bearings provide mechanical interfaces between the spool assemblies and the static engine structure. Mounted to that structure are a myriad of actuatable systems or assemblies/sub-assemblies under the control of control systems.

Figure 6:
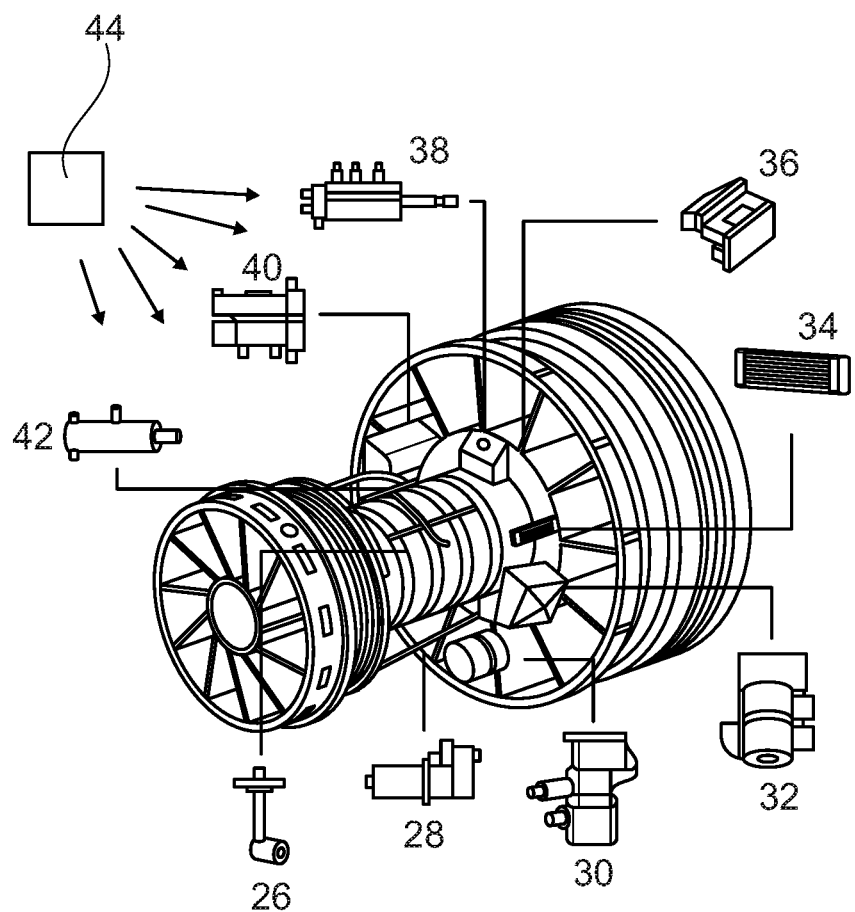

FIG. 6 shows by way of example only, a number of assemblies/sub-assemblies under the control of control systems, each operating according to control system settings, and each of which can affect the operation of the engine and hence vibration. FIG. 6 shows only some systems relating to the engine combustion equipment, including fuel nozzle 26, fuel filter 28, main fuel pump 30, fuel metering unit 32, heat exchanger 34, fuel splitter valve 36, variable stator vane actuator 38, fuel return valve 40 and variable bleed valve actuator 42.

A simplified electronic engine controller 44 is shown for brevity, which may be a full authority digital engine controller (FADEC) responsible for fuel flow regulation and thrust management. Control instructions actuate the drives, valves, pumps, etc for engine operation. Individual controllers may be provided for individual actuatable systems within the engine, e.g. under the authority of control hierarchy. An onboard network allows communication of sensor signals to monitor a variety of operational variables, such as shaft speeds, vibration, temperature, flow, torque, etc., to provide feedback to the control system during engine operation.

The method and system according to this disclosure may result in implementation of FADEC operation that better accommodates the sensitivity of the machine to different contributions to vibration by the control of the different assemblies/sub-assemblies.

Returning to FIG. 1, a plurality of FEA calculations/simulations (referred to herein as instances) are run for the same CAD model in parallel or series, i.e. such that the results of each simulation can be used collectively once available. Each instance in this example involves a whole engine simulation, i.e. including all major assemblies and sub-assemblies of the engine and the interactions therebetween that are relevant to vibration assessment.

A first instance involves a novel simulation that includes dynamic loads induced by the control system(s) as will be described in further detail below. A second instance involves a more conventional FEA simulation of the engine standard (e.g. residual unbalance) harmonic response.

The output of these two simulations allows the contributions of the control systems to the assessed. A comparison of the different simulation outputs allows numerical definition of the control system induced vibration over the operational range based on the operational parameters that are under the control of the control system. It will be appreciated that the precise control parameters will differ dependent on the nature of the assembly, sub-assembly but will typically include speeds, including rotational/angular speed, torque, loads, displacements, etc.

This novel technique thus allows determination of a maximum admissible stress that can be contributed specifically due to the control system generated resonances.

In order to achieve a high stability/low vibration engine, vibration limits can be set. Using the different FEA simulation outputs, the contribution of the control systems to the engine vibration can be determined and corresponding control parameter limits can thus be set at step 46. These limits can be communicated as targets/thresholds for the control system. Typically these targets can be defined as numerical values for the relevant control parameters.

However, assuming the limits may not be readily achievable by an existing control system, the targets/thresholds are fed as inputs to a further stage 48, in which mathematical modelling of the machine operation and control systems is used to resolve the functional/control requirements and ensure the targets are achieved over the operational range of the engine.

In this regard, the data passed from the FEA simulation outputs to the mathematical modelling environment may comprise a sensitivity parameter value for the different locations (i.e. assemblies or sub-assemblies). The sensitivity parameter may provide an indication of the sensitivity of a sub-assembly to vibration induced by the control system in that location or one or more further location in the engine.

In this example, a mathematical modelling tool is used such as Simulink® which comprises model-based design software made available by MathWorks®. A graphical user interface may be used to manage the functional relationships between the modelled system components. However the mathematical modelling differs from the FEA environment in that it models control functions and operational variables without geometry, or with simplified geometric considerations.

The stage 48 may be considered to comprise a tuning stage, in which the available range of control parameters are explored within the confines of the input signals and the required machine outputs over the operational range of the engine.

A model of this kind will define a hierarchy of operational requirements for the engine that must be met for correct engine operation. For example, the thrust output of a gas turbine engine is a critical output of the engine that must be achieved for a given throttle setting. Such operational requirements at a higher level of a control hierarchy thus define the limits within which control parameters lower in the hierarchy can be altered. The mathematical model used for simulating the operational procedures thus reconciles these requirements and iterates simulations in order to arrive at solutions which lie within the targets for the vibration-related control parameters set as the output of stage 10.

Figure 3:
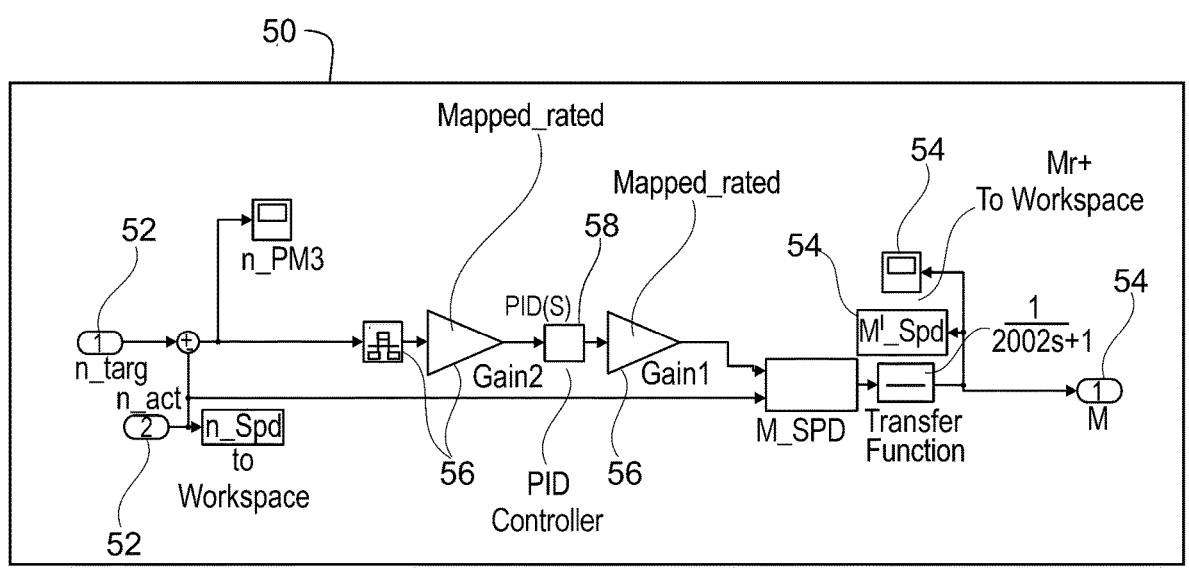
FIG. 3 shows a graphical representation of an example of a mathematical model for tuning machine operation.

An example of the graphical structure depicting a portion of a mathematical model of this kind is shown in FIG. 3. The model 50 has defined data inputs 52 and data/control signal outputs 54. A number of elements/blocks 56 are modelled which impact the input(s) to, or output(s) from, a controller 58, in this case a PID controller.

In the commercial software tools that are available, there are features called PID Tuners that provides pre-built methods for single-loop PID tuning to be applied on the controller blocks that are used to simulate the control systems loops present in the system. Using these methods, it is possible to tune PID controller parameters to achieve a robust design with the desired response time.

A typical design workflow with the PID Tuner involves the following tasks:

(1) Launch the PID Tuner. When launching, the software automatically computes a linear plant model from the Simulink model and designs an initial controller.

(2) Tune the controller in the PID Tuner by manually adjusting design criteria in two design modes. The tuner computes PID parameters that robustly stabilize the system, based on the optimization of the solutions of electro-mechanics dynamic derivative equations.

(3) Export the parameters of the designed controller back to the PID Controller block and verify controller performance running again the model until the required convergence is achieved.

The output of the mathematical modelling process comprises control system settings that are required so as to meet the targets defined by the FEA outputs. Those settings may comprise any, any combination, or all of:
Proportional derivative integrative (PID) gains for the controller/system
Filters
Internal settings for drives/servomechanisms, etc
Loop settings Turning now to FIG. 4, there is shown further details of the FEA process of stage 10. The geometric model 14 is imported or created at 60, including meshing of the geometry vibration/stress modelling. Two instances of the modelling are run as shown by paths A and B.

Figure 4:
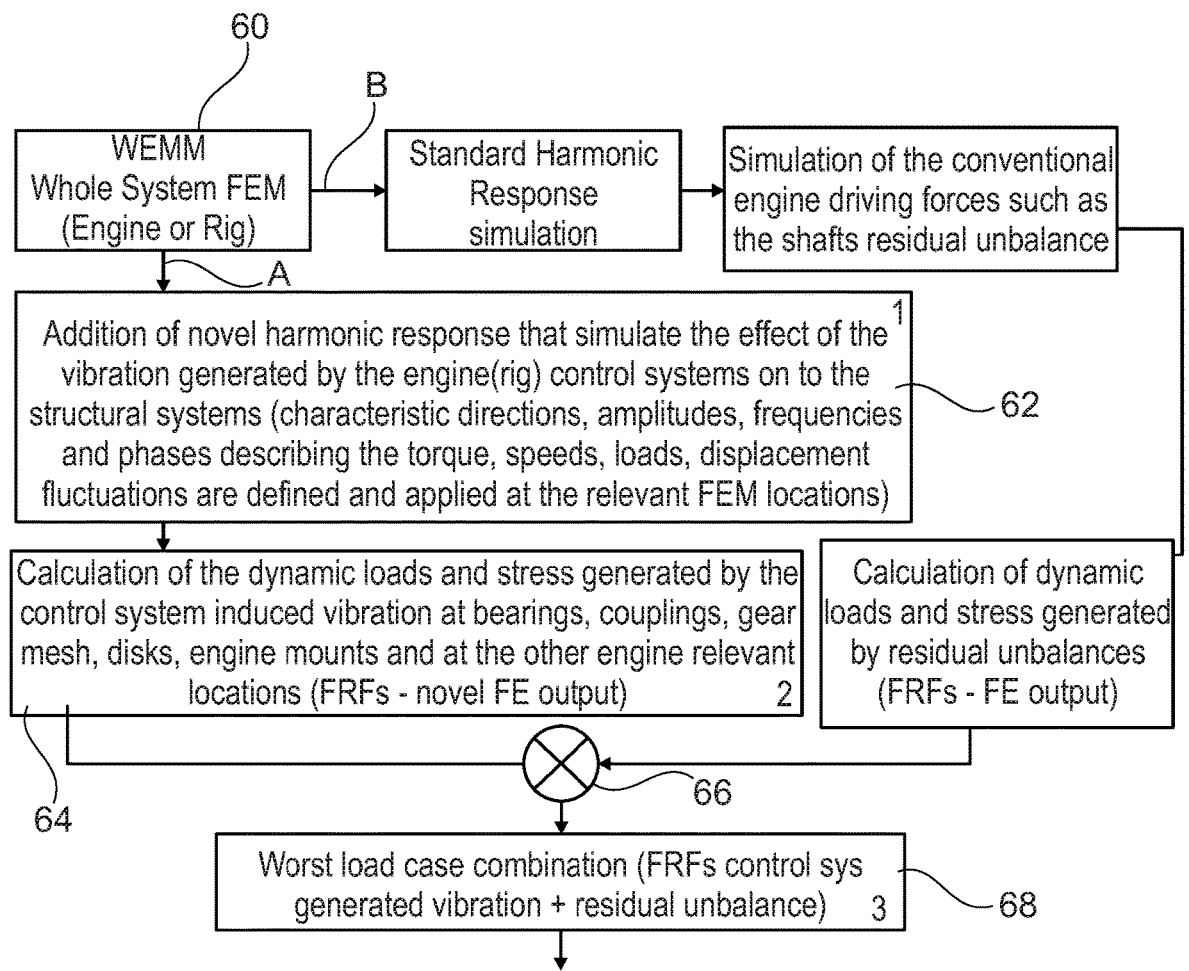
FIG. 4 is a flow diagram showing further detail of the modelling steps performed according to an example of the disclosure.

Path A is described at steps 62 and 64 in FIG. 4. Step 62 involves the introduction of control system generated harmonic loads in the whole engine model. These loads are defined in terms of any, any combination or all of their: location, magnitude, frequency, harmonic number and/or phase. The harmonic response determination is performed at the whole machine level.

The control system effect on the engine structural system is defined in terms of any, any combination, or all of the characteristic direction, amplitude, frequency and phase used to describe engineering/operational variables such as torque, speed, load or displacement. These are then applied at the relevant locations 66 in the geometric model as shown in FIG. 2.

At step 64, the finite element analysis is performed to generate results of the dynamic loads and stress generated by the control system induced vibration at specified locations in the engine, such as at bearings, couplings, meshing gears, disks, engine mounts amongst other relevant locations, typically including interfaces in the engine between adjoining or adjacent components, sub-assemblies or assemblies. Locations may comprise mechanical joints, support locations, actuation contact points or couplings, etc.

Path B takes the form of a standard harmonic response simulation and results in determination of dynamic loads and stresses generated throughout the geometric model by residual unbalances. The output may comprise a plurality of frequency response functions (FRF).

At step 66 the results of paths A and B are combined. This may be considered to comprise an addition of the results from paths A and B in order to ascertain worst case scenarios, where the FRFs equate to a summation of the residual unbalance from path B with the control system generated vibration from path A.

This output 68 is then fed to the mathematical simulations of operational procedures, e.g. the control system tuning procedures, of stage 48 as described above.

The outputs of the process may comprise any, any combination, or all of:
  Identification of the system resonances excited by the control systems and evaluation of their criticality, e.g. in terms of structural loads/stress (LCF/HCF);
  Identification of the not-to-exceed amplitudes for the control system loop generated vibration;
  Identification of the best design locations to locate the control loop sensors (low vibration locations) in order to have a loop signal naturally unresponsive to critical system resonances.

Any, or any combination, of the above outputs may be considered to provide an indication of the sensitivity of different locations/sub-assemblies in the engine to control system induced vibration. The impact of vibration generated, e.g. by control of an actuator, in one part of the engine on another location in the engine can thus be assessed and accommodated in control system instructions.

Figure 5A:
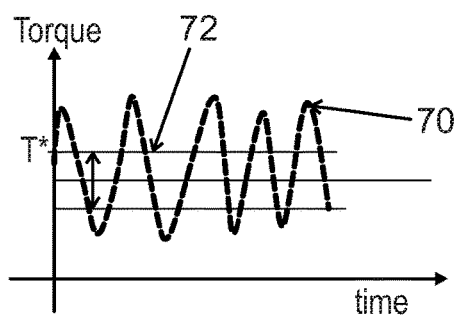
FIGS. 5A and 5B show respective fluctuations in plots of torque for a machine shaft before and after tuning in accordance with an example of the present disclosure; and, FIG. 6 shows a variety of sub-assemblies for an example of a machine, to which the method of the present disclosure may be applied.
Figure 5B:
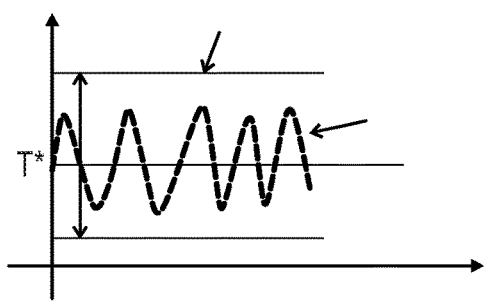

Turning to FIGS. 5A and 5b, there are shown two different plots of torque against time. In FIG. 5A, there is shown a fluctuation in torque, indicated as line 70, e.g. because of a system response—control system interaction at a frequency fn. The limits 72 that are imposed as a result of the FEA simulations, indicated at step 46 in FIG. 1, are exceeded in this example and so system tuning is required in order to bring the fluctuations to within the limits.

FIG. 5B shows an acceptable result after tuning in which the fluctuations for torque at the frequency fn do not exceed the limits, thereby indicating that the stable (low vibration) operation of the system can be confirmed, at least insofar as torque contributes to machine vibration.

In various examples of the disclosure, the control system tuning procedure and the definition of numerical targets to be achieved thereby, may comprise:
  a) Identification of the system resonances that are excited by the control systems and evaluation of their criticality, e.g. in terms of structural loads/stress (LCF/HCF). The resonance criticality assessment includes the residual unbalance contribution to vibration.
    Generate combined FRFs representing the system dynamic response versus frequency at several locations (such as: displacements, rotations, loads, vibrations, stress, torque, moments, misalignment)
    Tabulate the critical frequencies at which to minimise the control system loop output, in terms of residual fluctuation on the target signals
  b) Identification of the not-to-exceed amplitudes for the control system loop generated vibration:
    Generate matrix with max allowable fluctuation of torque, loads, speeds and displacements at each critical frequency—residual fluctuation admitted after the control loop tuning procedure
    Define not-to-exceed amplitude limits for torque, load, speed displacement fluctuations to guarantee safe operations (if the limits are exceeded, a re-tuning procedure is required)
  c) Identification of the best design locations to locate the control loop sensors (low vibration locations) in order to have a loop signal naturally unresponsive to critical system resonances.

Whilst it can be appreciated that this approach can be taken in the design phase of a machine/engine, e.g. using only simulated operation, it is important to note that the results, i.e. the control system settings will be applied in service.

Furthermore the approach of the present disclosure can also be used in a machine test or in-service operation scenario.

That is to say, the tuning procedure can be run and rerun based on sensed operation data as well as data calculated from simulation. In each case the thresholds derived from the FEA results can be used to implement thresholds or targets for the control system and/or tuning procedure (i.e. limits that are adhered to by the control system). The tuning procedure and/or other algorithms to manage vibration can be implemented as a control interface that receives the relevant sensor signals from the engine and adjusts control settings to ensure that the engine operates in a high stability/low vibration regime.

When used in service, it is not necessary to rerun the FEA analyses and so a reactive/dynamic system for adjusting control system parameters/thresholds implemented. Such as system is advantageous since it can operate quickly.

One aspect of the disclosure thus provides a control system for a machine or else machine-readable instructions for the controller (e.g. one or more data processors) to operate/modify control parameters to be within the relevant limits described above.

The controller may be implemented within the controller 44 of FIG. 6 or else within another controller onboard the engine and may be incorporated into the relevant control loops. Additionally or alternatively, the methods described herein could be implemented as part of a wider equipment health monitoring procedure, e.g. in which any fluctuations that departs form the defined limits can be assessed for potential longer term machine health degradation.

An example of the functionality of a processing system that is offline (or non-adaptive), e.g. for use in design or monitoring scenarios, comprises:
  Influence a coefficient matrix that correlate the stress peaks to the control system parameter settings (so called tuning).
  Run a numerical routine for the comparison of the stress generated by the control systems with threshold stress limits
  Calculate the control system setting adjustment necessary to minimise the stress peak exceedances For an adaptive control system that is implemented as a novel engine controller based on the present disclosure, the controller may comprise one or more module of code or algorithm to perform any, any combination, or all of:
  Acquire and condition signals from engine sensors, such as vibration, temperature and/or speed signals
  Analyse the data/signals in time and frequency domains
  Evaluate the resonance peak values
  Measure the damping on the actual measured resonance peaks and correct an algorithm matrix
  Measure the time in which the engine dwells the resonance peaks Compare the obtained values with the not-to-exceed stress limits Correct the control system settings if any exceedance of stress is detected by the algorithm Transmit the new parameters to FADEC logic (upon safety cases protocols)

Calculate the peak exceedance for residual lifing estimation

Transmit to the engine control algorithms/logic any speed modifications for resonance detuning The output of the present disclosure may be implemented as values for filters, active damper settings, PID parameters, etc in the control system(s) loop(s). They may be adaptive or not and may be used in simulated or real scenarios. In any implementation scenario, the control interface and associated control algorithms using the limits as described herein is believed to be novel.

According to an aspect of the disclosure methods/systems disclosed herein may comprise a merging of two separated highly specialised software environments (e.g. by communication of target outputs of one environment to the other) in order to minimize at each flight/operation condition of a machine the vibration, and combining the influence coefficients in an HW interface in order to feed machine control system settings.

Potential advantages provided by a system/method as described herein comprise:

A system level (e.g. whole machine/rig) approach for generating the control system targets can help ensure low vibration/high stability control systems throughout the operational range for the machine Control system tuning targets can be set based on specific numerical targets for residual vibration on actual/individual control parameters, such as speeds, torque, loads, displacements, etc.

The ability to carry through findings from a design/simulation stage into more meaningful control measures in machine testing/use.

The possibility to reduce physical damping measures needed on the machine

The invention claimed is:

1. A method of managing vibration in a machine having a plurality of sub-assemblies, the method comprising:
generating a computational model for the machine, the computational model including a geometric model of the machine, which includes the plurality of sub-assemblies and at least one module of machine readable code defining how vibration is communicated through the geometric model;
executing a first instance and a second instance of the generated computational model, each executed instance of the generated computation model generates outputs including (i) loading on the machine geometry as a result of the vibration of the geometric model under a simulated machine operating condition, and (ii) a plurality of sensitivity parameter values each indicating a respective sensitivity of each sub-assembly of at least a sub-set of the plurality of sub-assemblies to vibration induced by a control system, the first instance executing a simulation on the plurality of sub-assemblies that is different than a simulation executed by the second instance on the plurality of sub-assemblies, the first instance and the second instance respectively include the computational model with and without inclusion of vibration induced by the control system for each sub-assembly of the plurality of sub-assemblies of the machine;
determining a maximum loading threshold for the machine;
comparing the generated outputs of the first instance of the computational model with the generated outputs of the second instance of the computational model to set a threshold for one or more control parameter under the control of the control system based on the contribution of the vibration induced by the control system in order not to exceed the maximum loading threshold; and
transmitting energy, by the control system, in use, within the machine that prevents the machine from exceeding the determined maximum loading threshold.

2. The method according to claim 1, wherein executing the first instance includes determining, using the geometric model, dynamic loading or stress generated by the control system induced vibration at one or more location in the machine.

3. The method according to claim 1, wherein executing the second instance includes calculating dynamic loading or stress generated by a residual unbalance of the machine.

4. The method according to claim 1, further comprising implementing the threshold for the one or more control parameter within a memory of the control system or operating the machine including the control system according to the set threshold for one or more control parameter.

5. The method according to claim 1, wherein the threshold includes any one of or any combination of a stress threshold, a vibration amplitude threshold, a loading amplitude threshold, and a torque amplitude threshold.

6. The method according to claim 1, wherein the computational model is a machine model of the entire machine in which a geometry of all of the plurality of sub-assemblies of the machine are comprised, along with any interactions or mechanical interfaces therebetween.

7. The method according to claim 1, wherein the geometric model includes a computer aided design (CAD) model which is discretised into multiple elements, and executing the first and second instances of the computational model include performing a finite element analysis of the CAD model.

8. The method according to claim 1, further comprising:
generating a further computational model for the machine, the further model including a mathematical model of machine operation for tuning machine operation in order to adhere to the one or more control parameter threshold.

9. The method according to claim 8, wherein the mathematical model outputs proportional derivative integrative gains for a controller of the control system.

10. The method according to claim 8, further comprising using the mathematical model to update or refine the threshold for the one or more control parameter.

11. The method according to claim 1, wherein the machine includes a rotor and the threshold for the one or more control parameter includes a magnitude of torque fluctuation for the rotor.

12. The method according to claim 1, further comprising sensing vibration, or a variable indicative of vibration, at one or more locations on the machine in use, and adjusting the threshold for the one or more control parameter based on the sensed vibration.

13. A non-transitory computer readable storage medium storing machine readable instructions that when executed by a controller of the control system for managing machine vibration performs the method of claim 1.

14. A control system for managing machine vibration of a machine, the control system comprising:

one or more data storage storing:
- a first computational model for the machine, the first computational model including a geometric model of the machine, which includes a plurality of sub-assemblies and at least one module of machine readable code defining how vibration is communicated through the geometric model, and
- a second computational model that simulates the control system electrical response for the machine; and one or more computer processor configured to perform:
- executing a first instance and a second instance of the first computational model, each executed instance of the generated computation model generates outputs including (i) loading on the machine geometry as a result of the vibration of the geometric model under a simulated machine operating condition, and (ii) a plurality of sensitivity parameter values each indicating a respective sensitivity of each sub-assembly of at least a sub-set of the plurality of sub-assemblies to vibration induced by a control system, the first instance executing a simulation on the plurality of sub-assemblies that is different than a simulation executed by the second instance on the plurality of sub-assemblies, the first instance and the second instance respectively include the first computational model with and without inclusion of vibration induced by the control system for each sub-assembly of the plurality of sub-assemblies of the machine, and determining a maximum loading threshold for the machine from the first computational model;
- comparing the generated outputs of the first instance of the first computational model with the generated outputs of the second instance of the first computational model to set a threshold for one or more control parameter under the control of the control system based on the maximum loading threshold, and outputting the maximum loading threshold to an instance of the second computational model; and
- executing the instance of the second computational model as a tuning procedure for machine operation, and outputting one or more control instruction for implementation by a machine control system based on the output of the tuning procedure.

15. The control system according to claim 14, wherein the one or more computer processor performs writing the control instruction to the machine control system or operating a machine electrical system according to the control instruction implemented by the machine control system.

16. A non-transitory computer readable storage medium storing machine readable instructions that are executed by the one or more computer processor according to the control system of claim 14 for managing machine vibration.

* * * * *